(12) United States Patent
Huang et al.

(10) Patent No.: US 7,023,045 B2
(45) Date of Patent: Apr. 4, 2006

(54) LAYOUT OF A FLASH MEMORY HAVING SYMMETRIC SELECT TRANSISTORS

(75) Inventors: Jen-Ren Huang, Tainan (TW); Ming-Hung Chou, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 92 days.

(21) Appl. No.: 10/643,876

(22) Filed: Aug. 20, 2003

(65) Prior Publication Data
US 2005/0040457 A1 Feb. 24, 2005

(51) Int. Cl.
*H01L 29/76* (2006.01)
*H01L 29/788* (2006.01)
*H01L 21/336* (2006.01)
*G11C 16/04* (2006.01)

(52) U.S. Cl. .............. 257/314; 257/315; 257/316; 438/257; 438/259; 365/185.05; 365/185.12

(58) Field of Classification Search ........ 257/314–316; 438/257–265; 365/185.05, 185.12, 185.17, 365/185.21, 185.23
See application file for complete search history.

(56) References Cited

U.S. PATENT DOCUMENTS

| 6,438,028 B1 * | 8/2002 | Kobayashi et al. .... 365/185.05 |
| 6,845,042 B1 * | 1/2005 | Ichige et al. ........... 365/185.17 |
| 2003/0094635 A1 * | 5/2003 | Yaegashi ................... 257/250 |

* cited by examiner

*Primary Examiner*—David Nelms
*Assistant Examiner*—Long Tran
(74) *Attorney, Agent, or Firm*—Rabin & Berdo, P.C.

(57) ABSTRACT

A layout of flash memory having symmetric select transistors includes a memory cell array and a polysilicon gate. The polysilicon gate forms a plurality of select transistors in coordination with a plurality of pairs of sources/drains, so as to connect to the memory cell array. The polysilicon is perpendicularly extended toward a direction of the memory cell array, thereby overcoming a drawback as select transistors being unsymmetrical in a prior flash memory structure.

4 Claims, 3 Drawing Sheets

LAYOUT OF A FLASH MEMORY HAVING SYMMETRIC SELECT TRANSISTORS

FIELD OF THE INVENTION

The present invention relates generally to a flash memory, and more particularly, to a layout of a flash memory having symmetric select transistors.

BACKGROUND OF THE INVENTION

Referring to FIG. 1 showing a typical flash memory, a flash memory circuit 10 comprises a memory cell array 12 consisted of a plurality of storage transistors, with each of them being a memory cell; and an X-decoder 14 and a Y-decoder 16 for selecting specified memory cells with respect to columns and rows from the memory cell array 12. The selected memory cells are connected to a data line (DL) via a select transistor 18. Voltage or current variations in the DL are detected using a sensor amplifier 20, and compared with a reference cell. Data signal OUT is then produced at an output of the sensor amplifier 20.

Considering the circuit in FIG. 1, performance distinctions arise owing to differences in actual integrated circuits when disposed at chips. Referring to FIG. 2 showing a conventional schematic view of a layout of a conventional flash memory, the layout comprises a diffusion region 32 in a memory cell array region 30, a buried diffusion layer 34 extended across the diffusion region 32, polysilicon gates 42 and 44 formed in a select transistor region 40 and at the diffusion region 32, with the polysilicon gates 42 and 44 extended in a direction parallel to the memory cell array region 30, and a plurality of select transistors 40 formed at a source/drain arranged at two sides of the polysilicon gate 44 for connecting to the buried diffusion layer 34 at the memory cell array region 30. The polysilicon gates 42 and 44 are controlled for conducting or shutting the transistors, so as to select specified memory cells. However, for that the polysilicon gates 42 and 44 are parallel to the memory cell array region 30, individual select transistors are resultantly unsymmetrical with respect to the memory cell array region 30. Through contact windows 48, the two sides of the polysilicon gates 42 and 44 are connected to the buried diffusion layer 34 and the drains/sources of the select transistors. The asymmetrical characteristic of select transistors, such as various speeds of different select transistors, is likely to cause numerous unfavorable effects and hence degrade performances. Therefore, it is a vital task as how to provide a layout of flash memory having symmetric select transistors.

SUMMARY OF THE INVENTION

An object of the present invention is to provide a flash memory having symmetric select transistors.

In a layout of a flash memory having symmetric select transistors, according to the invention, it is comprised a memory cell array, and a polysilicon gate corresponding to a plurality of select transistors and perpendicularly extended toward a direction of the memory cell array, so as to have the plurality of select transistor arranged in a symmetric arrangement with respect to the memory cell array in overall.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
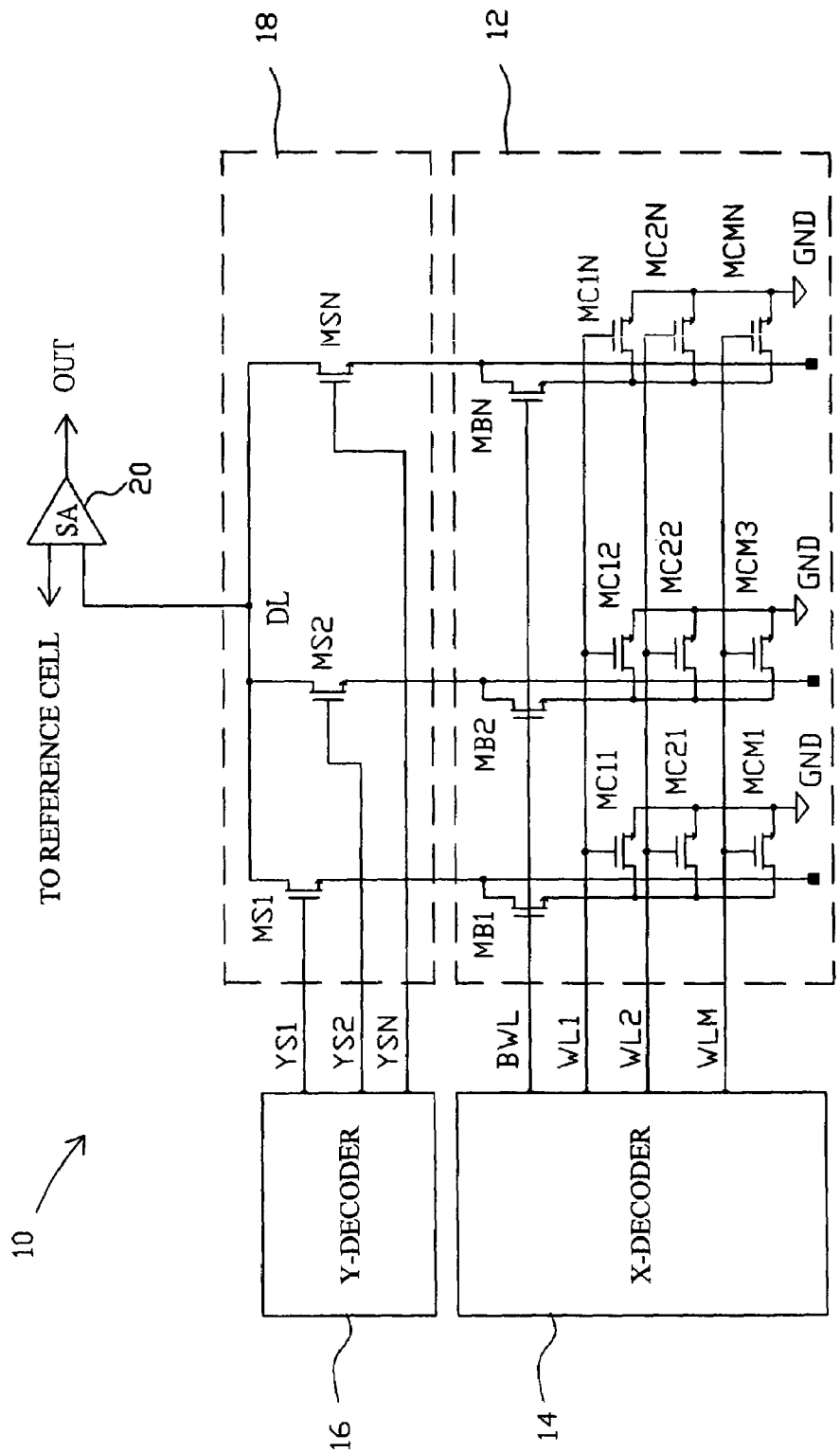
FIG. 1 shows a schematic view of a typical flash memory circuit.
Figure 2:
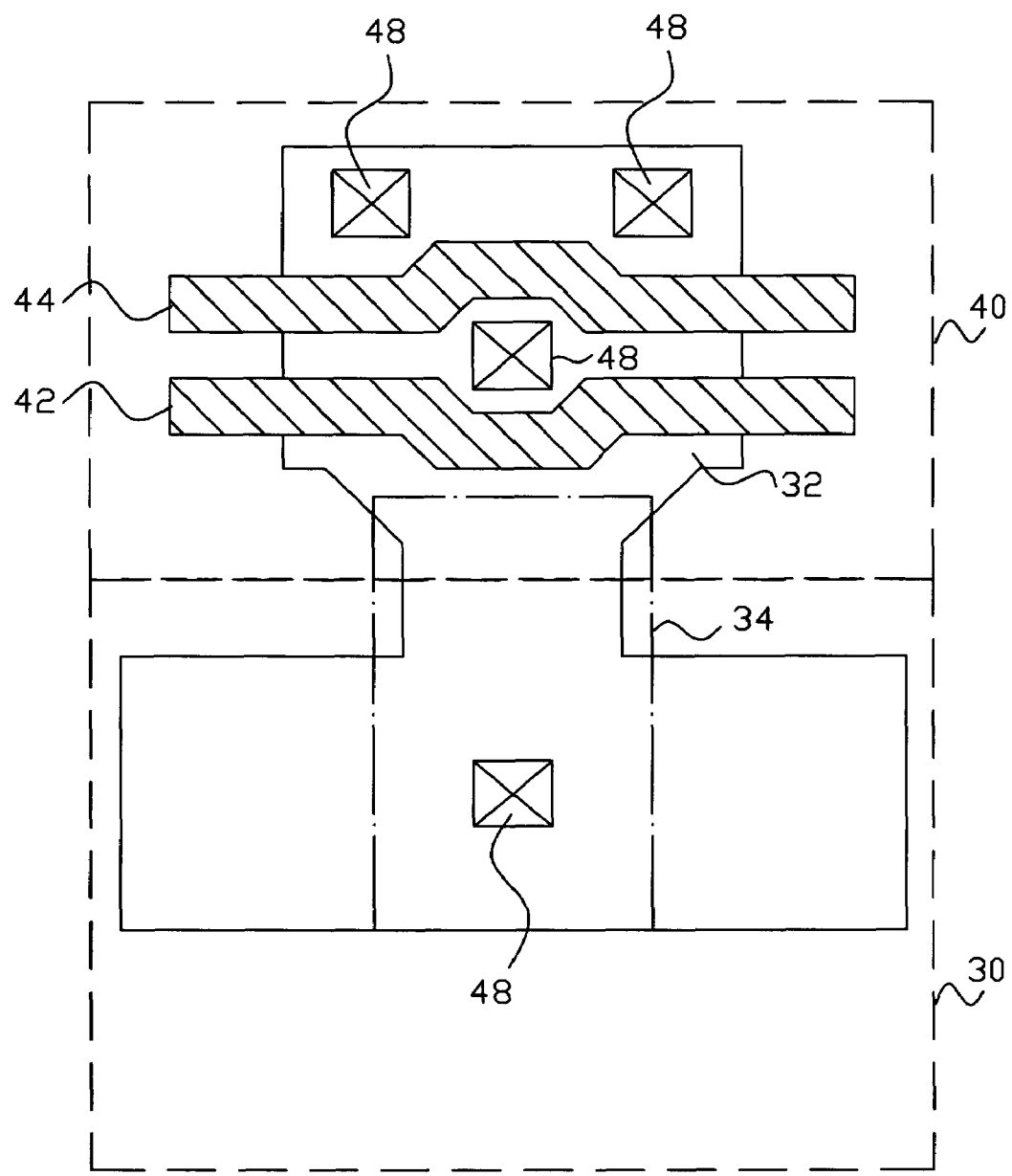
FIG. 2 shows a schematic view illustrating a layout of a prior flash memory.
Figure 3:
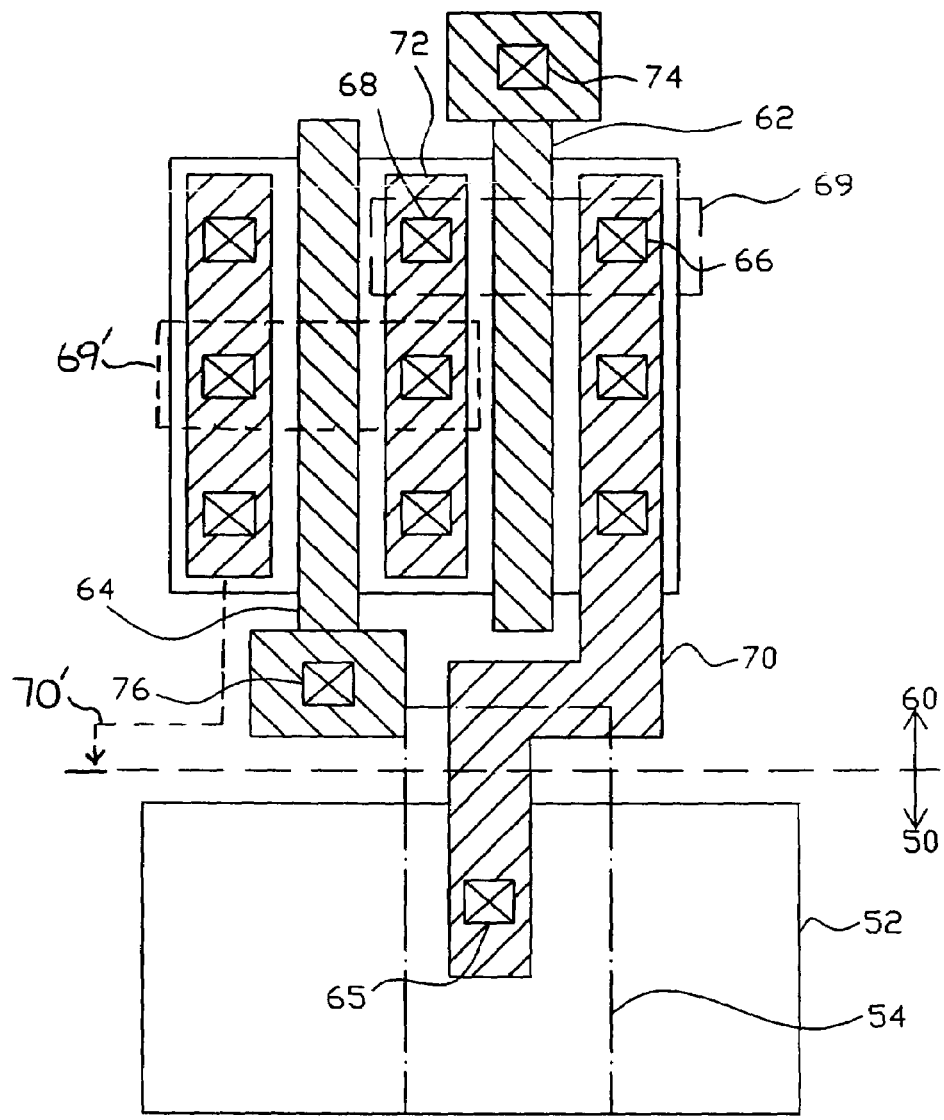
FIG. 3 shows a schematic view illustrating a layout of the flash memory according to the invention.

Referring to FIG. 3 showing a schematic view illustrating a layout of the flash memory according to the invention, the layout comprises a diffusion region 52 in a memory cell array region 50; a buried diffusion layer 54 extended across the diffusion region 52; a select transistor region 60 having polysilicon gates 62 and 64, which are parallel to each other and perpendicularly extended toward a direction of the cell memory array region 50; a metal wire 70 extended from the memory cell array region 50 to one side of the polysilicon gate 62, passed through the contact windows 65 and 66, and connected to the buried diffusion layer 54 and a source of a select transistor 69; and a metal wire 72 extended between the polysilicon gates 62 and 64, passed through the contact window 68, and connected to a drain of the select transistor 69. The buried diffusion layer 54 is for serving as a bit line of the memory cells. The polysilicon gates 62 and 64 input voltages through contact windows 74 and 76, so as to control conductance of corresponding select transistors (e.g., the select transistor 69 and a select transistor 69' that is coupled to the memory cell array region 50 by a wire 70' that is shown only schematically) to further select specific memory cells for access. The contact windows 74 and 76 are disposed in opposition for reducing an area occupied by the select transistors.

In the layout of flash memory according to the invention, the polysilicon gates 62 and 64 are perpendicular to the memory cell array region 50, and therefore the select transistors formed at two sides of the polysilicon gates 62 and 64 are symmetric with respect to the memory cell array region 50 in overall. Consequently, the flash memory having symmetric select transistors according to the invention is capable of overcoming drawbacks and derivative effects of conventional flash memory having unsymmetrical select transistors.

It is of course to be understood that the embodiment described herein is merely illustrative of the principles of the invention and that a wide variety of modifications thereto may be effected by persons skilled in the art without departing from the spirit and scope of the invention as set forth in the following claims.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A layout of a flash memory having a plurality of symmetric select transistors, comprising:
   a memory cell array;
   polysilicon gates of the plurality of symmetric select transistors extending in a direction perpendicular to a side of the memory cell array and cooperating with a plurality of pairs of sources/drains for forming the plurality of symmetric select transistors; and
   wires connecting the plurality of symmetric select transistors and the memory cell array.

2. The layout according to claim 1, wherein the wires comprises segments parallel to the polysilicon gates.

3. A layout of a flash memory having a plurality of symmetric select transistors, comprising:
   a memory cell array; and
   polysilicon gates corresponding to the plurality of symmetric select transistors extending in a direction perpendicular to a side of the memory cell array;
   wherein the plurality of symmetric select transistors are arranged substantially symmetric with respect to the side of the memory cell array.

4. The layout according to claim 3, further comprising a metal wires extending from the memory cell array toward the polysilicon gates for connecting the plurality of symmetric select transistors to the memory cell array.

* * * * *